United States Patent
Morong et al.

(10) Patent No.: US 8,004,344 B2
(45) Date of Patent: Aug. 23, 2011

(54) GATE-CHARGE RETAINING SWITCH

(75) Inventors: William H. Morong, Paoli, PA (US); Thomas E. Lawson, Malvern, PA (US)

(73) Assignee: Lawson Labs, Inc., Malvern, PA (US)

(*) Notice: Subject to any disclaimer, the term of this patent is extended or adjusted under 35 U.S.C. 154(b) by 0 days.

(21) Appl. No.: 12/617,260

(22) Filed: Nov. 12, 2009

(65) Prior Publication Data
US 2010/0052768 A1  Mar. 4, 2010

Related U.S. Application Data

(63) Continuation-in-part of application No. 12/334,692, filed on Dec. 15, 2008, now abandoned.

(60) Provisional application No. 61/014,204, filed on Dec. 17, 2007.

(51) Int. Cl.
*H03K 17/687* (2006.01)

(52) U.S. Cl. .................. 327/427; 327/108; 363/127

(58) Field of Classification Search .................. 327/427, 327/432, 434, 108–112; 363/21.06, 21.14, 363/127
See application file for complete search history.

(56) References Cited

U.S. PATENT DOCUMENTS

| | | | | |
|---|---|---|---|---|
| 4,461,966 A * | 7/1984 | Hebenstreit | ............... | 327/432 |
| 4,484,084 A * | 11/1984 | Cheffer | ............... | 307/64 |
| 4,511,815 A * | 4/1985 | Wood | ............... | 327/436 |
| 5,635,867 A * | 6/1997 | Timm | ............... | 327/427 |
| 6,377,477 B1 * | 4/2002 | Xie et al. | ............... | 363/21.14 |
| 6,839,246 B1 * | 1/2005 | Zhang et al. | ............... | 363/21.06 |
| 7,035,120 B2 * | 4/2006 | Tobita | ............... | 363/21.06 |
| 7,764,518 B2 * | 7/2010 | Jitaru | ............... | 363/21.12 |

* cited by examiner

*Primary Examiner* — Lincoln Donovan
*Assistant Examiner* — William Hernandez
(74) *Attorney, Agent, or Firm* — Rudoler & DeRosa LLC

(57) ABSTRACT

This invention provides a means and method for preventing unwanted semiconductor turn-on and turn-off, caused by a high rate of voltage change, without significantly affecting the desired ON and OFF transitions of the semiconductor. According to this invention, time is provided during either or both bistable ON and OFF semiconductor states, during which the semiconductor gate is allowed to float, neither being driven ON or OFF, and circuitry for lowering gate-node impedance at non-transitional times to prevent state disruptions by dV/dT is provided.

5 Claims, 6 Drawing Sheets

GATE-CHARGE RETAINING SWITCH

CROSS-REFERENCE TO RELATED APPLICATIONS

The present application is a continuation-in-part of U.S. application Ser. No. 12/334,692 filed Dec. 15, 2008 which claims the benefit of U.S. Provisional Application No. 61/014,204 filed on Dec. 17, 2007, which is incorporated herein by reference.

STATEMENT REGARDING FEDERALLY SPONSORED RESEARCH OR DEVELOPMENT

The present invention was not developed with the use of any Federal Funds, but was developed independently by the inventors.

BACKGROUND OF THE INVENTION

The use of retained gate-charge to hold a FET switch in an essentially bistable state is well-known, being the operational basis of ubiquitous DRAM's used in computers. The use of retained gate-charge to hold the state of a power switch is less common, but is known in synchronous rectifier applications. U.S. Pat. Nos. 7,035,120, 6,940,732, 6,839,246, and 6,377,477 exemplify such use, in which gate-charge and the means for removing same are automatically derived from a power transformer being switched. Other switches have stored charge external to the switch device itself as exemplified by U.S. Pat. Nos. 6,686,729 and 6,600,145. The field of power conversion is replete with examples of switches driven without exploiting gate-charge retention. In such cases, switch enhancement voltage must be provided during the entire switch ON time. For well-known "high-side" switches, and for bipolar switches, either a floating enhancement-voltage supply, or an inductor or transformer requiring reset time, become necessary inconveniences. Usually, isolated control-signal drivers must be provided with floating supplies.

SUMMARY OF THE INVENTION

Charge is injected into a switch-device gate to turn the switch ON responsively to a control signal. Charge is removed from the switch-device gate to turn the switch OFF responsively either to the same, or to another, control signal. Control circuitry interfaces between the one or more control signals and the switch-device. In a preferred embodiment the charge is injected and removed through one or more transformers. Charge removal may immediately follow charge injection without having to wait for the charge-injection transformer to recover, enabling fast toggling of relatively large switch devices. A composite AC or bipolar switch comprising a plurality of essentially unipolar switch devices is disclosed. In the present invention, the switch ON state is maintained for a relatively long time without application of external voltage, and circuitry for refreshing the ON state, may be provided. In addition to providing bistable switching, this invention may supply both the power and isolation for driving MOSFET or IGBT devices. In one embodiment of the invention the switch may be designed so that it does not require a voltage higher than the load voltage being switched.

DETAILED DESCRIPTION OF THE DRAWINGS

Figure 1:
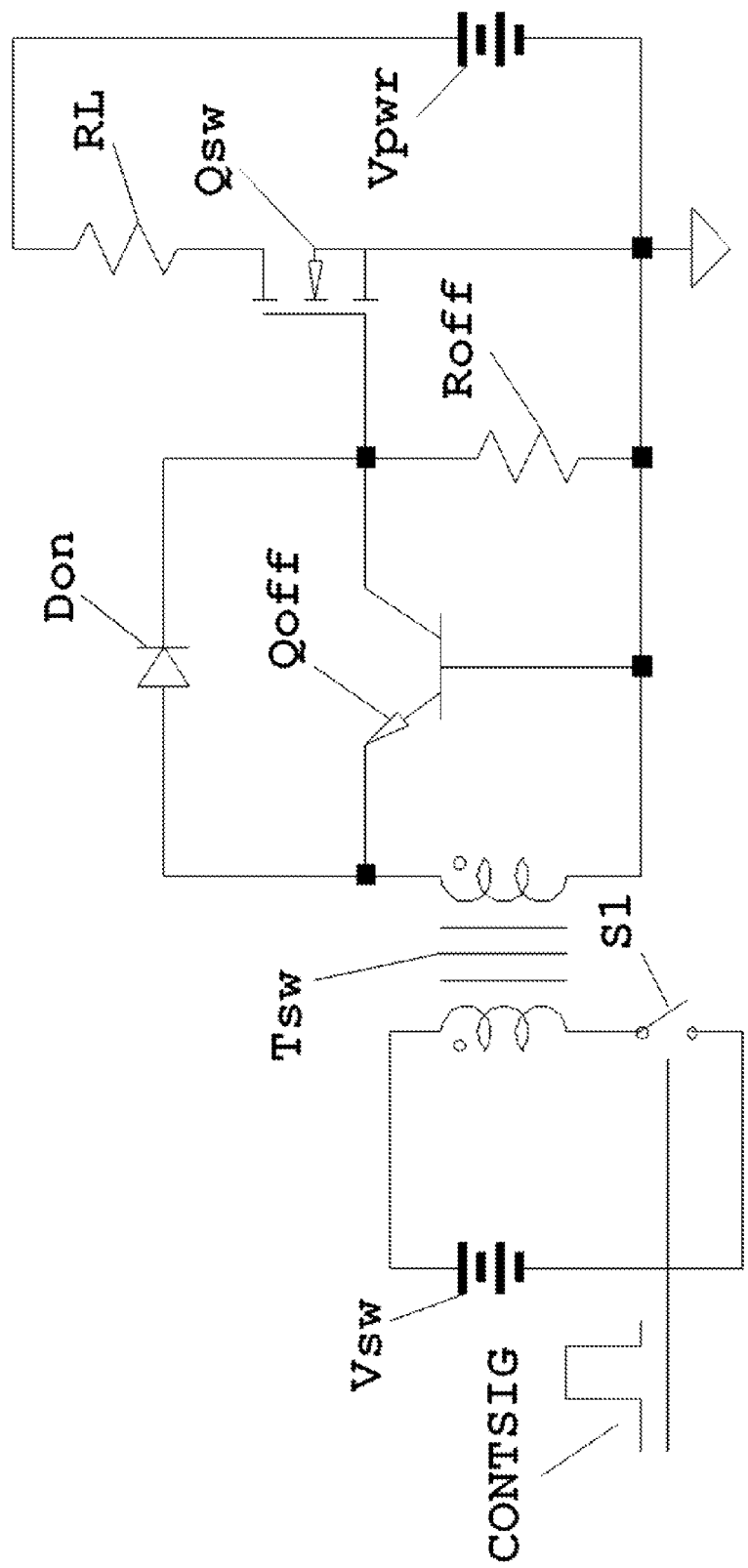
FIG. 1 illustrates a basic unipolar switch according to this invention.

Referring first to FIG. 1, there is shown a bistable switch according to the present invention. "Bistable" means that the switch is stable either in an ON or an OFF state, even if the external control signal is removed. In FIG. 1, each transition of a control signal changes the state of the switch.

In FIG. 1 a MOSFET, Qsw, switches current through load RL and source Vpwr responsively to the voltage between its gate and source. While the load shown is resistive, the invention may be used with any type of load, resistive, capacitive, inductive or any combination thereof. The N-channel device shown will be enhanced when the voltage applied to its gate is poled positive. Were a P-channel device being driven, the opposite polarity would be supplied.

The control circuitry works as follows. When the control signal CONT SIG goes positive, it turns on switch S1, connecting the primary winding of transformer Tsw across voltage source Vsw. Current rises in the primary of Tsw, inducing a voltage into the secondary winding of Tsw, its dotted end becoming positive. The positive voltage across Tsw secondary being applied to the anode of diode Don causes conduction therein, injecting charge into the gate of Qsw. The current in the Tsw secondary reflects into the primary thereof and is ultimately drawn from Vsw. This current into Qsw charges its gate capacitance and decays essentially to zero once the gate is charged. The magnetizing current in Tsw will continue to rise unless S1 is opened or unless that current is otherwise limited. In FIG. 1, a Tsw primary current sufficient to provide the energy needed to extract the gate-charge of Qsw should be maintained until it is desired to turn OFF Qsw. It should be noted that while Tsw current is being maintained substantially constant, there is no induced voltage across Tsw, and Tsw is not enhancing Qsw. Qsw is, rather staying ON due to its own stored gate-charge. When the CONT SIG falls, S1 turns OFF, and the magnetic field in Tsw causes its secondary to "fly back," driving negative its dotted pole. When that pole flies one diode-drop negative, BJT Qoff conducts, discharging the gate of Qsw, and turning OFF the switch. Resistor Roff is a large resistance provided to drain leakage currents from the gate of Qsw, thus preventing it from turning ON inadvertently.

The switch of FIG. 1 has potentially inconvenient limitations. Firstly, Tsw inductance must reasonably limit current during a maximum ON time. Secondly, significant OFF time is be required to reset the magnetic field of Tsw. Reset time may be somewhat reduced by adding a resistor in series with the emitter of Qoff. The practical limitations of FIG. 1 may impose duty-cycle constraints and a possible need for unreasonably large Tsw inductance. It should be noted that a MOSFET may be used for Qoff, and the body diode thereof for Don.

Figure 2:
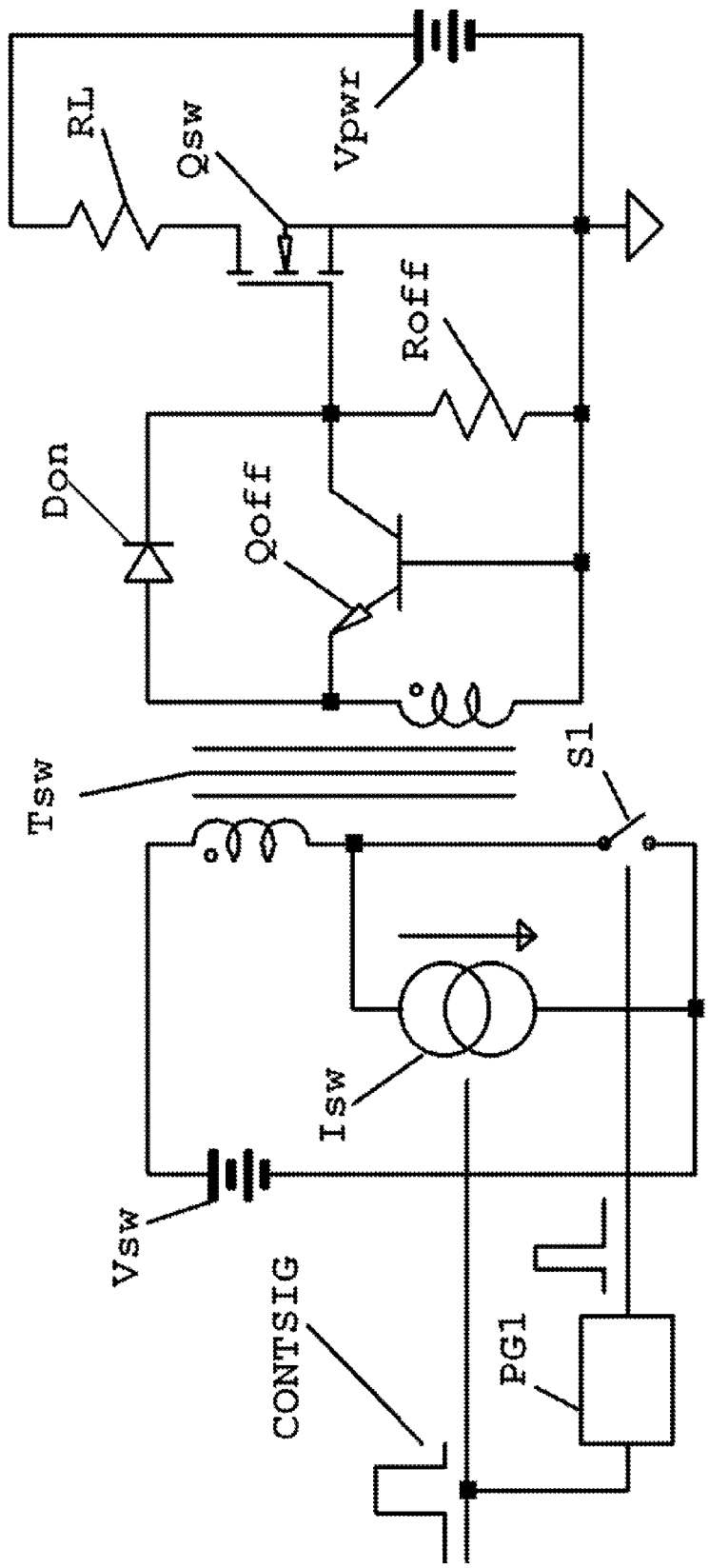
FIG. 2 shows an improved unipolar switch according to this invention

FIG. 2 shows a slightly improved unipolar bistable switch according to this invention. In FIG. 2, each transition of a control signal CONSTIG changes the state of the switch. In FIG. 2, when CONSTIG goes positive, pulse generator PG1 turns on S1 for a time adequate to supply the relatively large current needed to charge the gate of Qsw. When sufficient time has passed, perhaps 100 ns, for the gate of Qsw to be charged, PG1 falls, turning off S1. However, CONSTIG has also turned on current sink Isw, which remains ON responsive thereto. Thus sufficient Tsw current is maintained to supply the energy that will be required to turn OFF Qsw. When the control signal falls, Tsw "flies back", turning OFF Qsw just as it did in FIG. 1. In many uses, the circuit of FIG. 2 may be more practical than that of FIG. 1.

Figure 3:
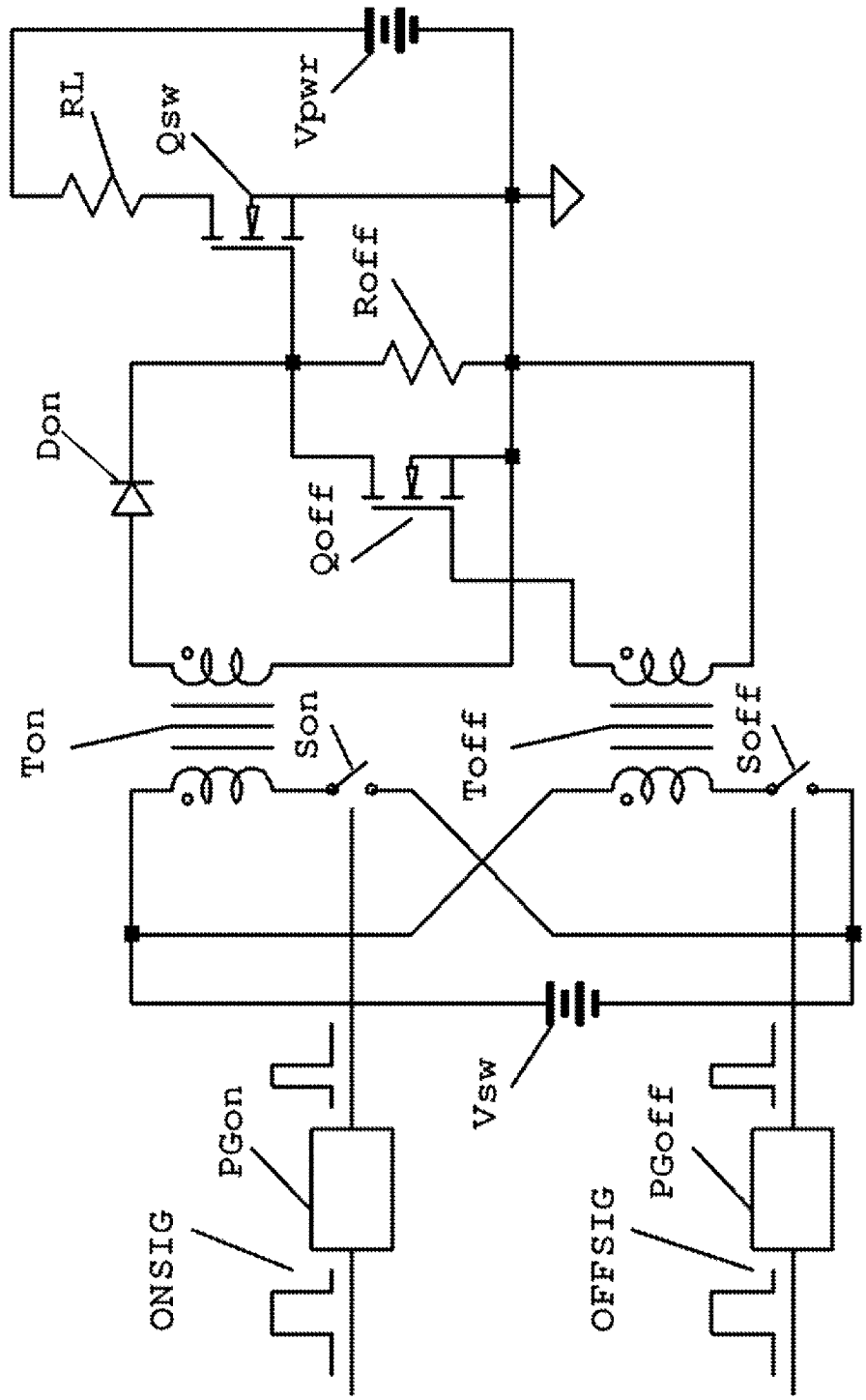
FIG. 3 shows an improved unipolar switch according to this invention, equipped for immediate gate-charge removal.

Referring to FIG. 3, a bistable switch according to this invention is shown. This circuit is much like those of FIGS. 1 and 2, but has two control signals ONSIG, to turn ON the switch, and OFFSIG to turn OFF the switch. FIG. 3 has two pulse generators PGon and Pgoff, two drive transformers Ton and Toff, two switches Son and Soff, all responsive to ONSIG and OFFSIG. When ON SIG rises, PGon generates a pulse, perhaps 100 ns long, activating Son for long enough to charge the gate of Qsw, just as did S1 of FIG. 2. No current is maintained in Tsw, which may commence magnetic-field reset as soon as Qsw is fully ON. Significant time, perhaps as much as 10 ms, may elapse with Qsw remaining ON. To provide indefinite Qsw ON-time, ONSIG or PGon may be repeatedly asserted to refresh the gate-charge of Qsw. When the switch is to be turned OFF, OFF SIG rises, causing a pulse from generator PGoff to activate Soff. Just as Tsw of FIGS. 1 and 2, and Ton of this figure, turn on Qsw, Toff turns OFF Qsw by extracting its gate-charge. It should be noted that it is possible to use a BJT for the Qoff function. Qoff rapidly discharges the gate of Qsw, turning OFF the switch. The output pulse of PGoff need last only long enough to discharge the gate of Qsw, perhaps 100 ns, after which magnetic field reset of Toff may commence. Toff may be reset while Ton is being used, and vice-versa, allowing a switching frequency of several MHz even with a relatively large MOSFETs. The switch of FIG. 3 is also less timing-critical than those of FIGS. 1 and 2 because turn-OFF does not depend on energy stored in a transformer, but on current drawn from Vsw as needed.

The term "bistable" means that it is not necessary to apply continuous energy external to the gate of the transistor in order to keep the switch on or off. One pulse of energy sufficient to charge its gate capacitance turns the transistor on and keeps it on for a relatively long period of time. A second pulse of energy, sufficient to remove charge from the gate and turns the transistor off. In other words, the state of the transistor is stable, without maintaining a supply of external energy on its gate, in either the on or off states. Thus this switch bistable. The novelty in this invention is that the charge required to keep the transistor in the on state is stored in the gate capacitance itself, as opposed to in a capacitor or other power reservoir external to the transistor, and is injected and removed responsive to a control signal. While similar techniques may have been used on a much smaller scale for DRAMs, it is unknown to apply such control of retained gate-charge at the power transistor level. While, as described in the previous paragraph, it may be necessary to refresh the gate periodically to handle discharge through Roff or gate leakage, the refresh happens over a relatively long time frame compared to the switching states of the transistor (microseconds). Such use of a refresh is meant to be within the scope of the terms "stable" and "bistable." Thus, the practice of this invention is characterized by pulsed injection of charge into and pulsed removal of charge from a gate-charge-retaining power transistor to effect stable on and off states respectively.

Figure 4:
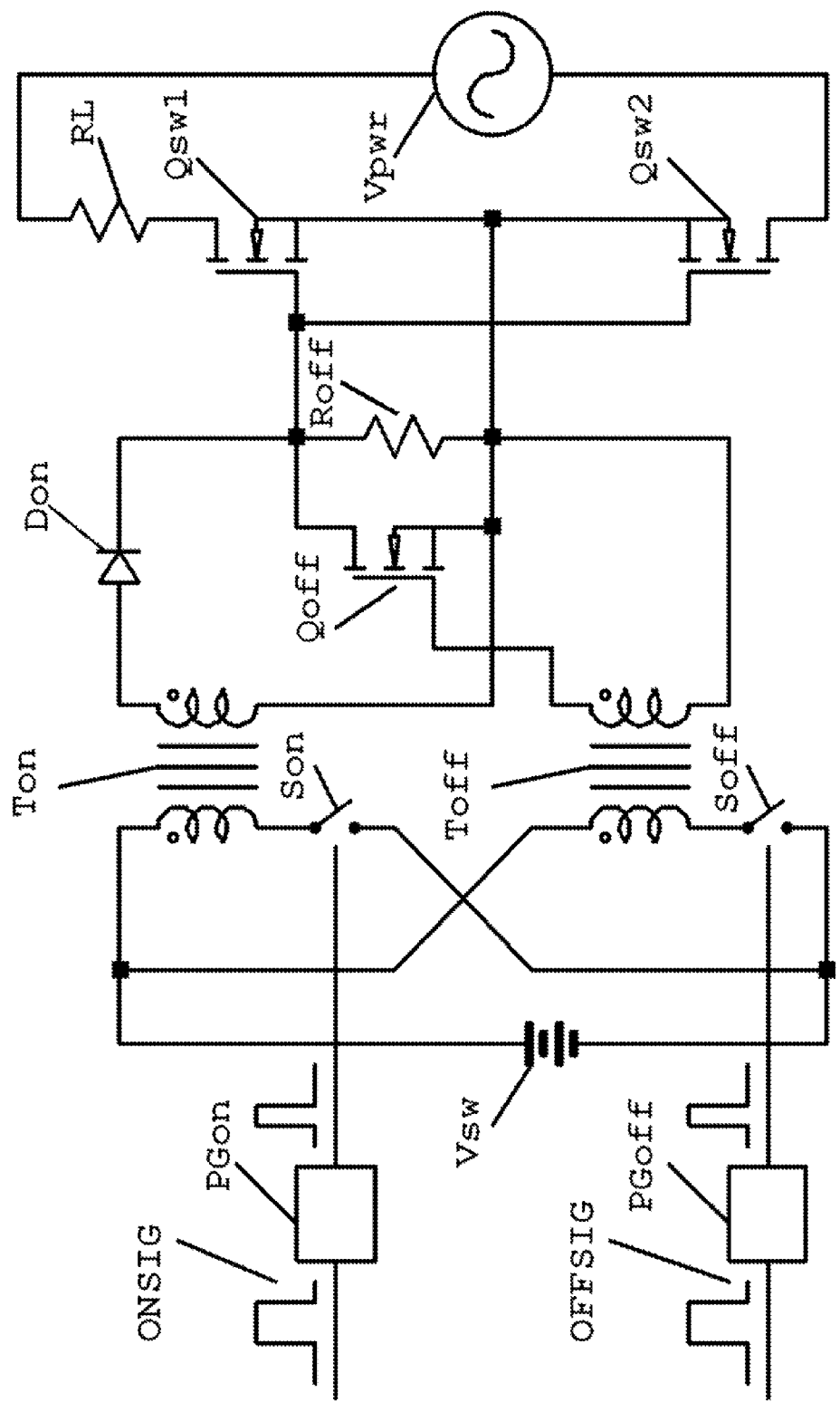
FIG. 4 shows an improved bipolar switch according to this invention, equipped for immediate gate-charge removal.

The switch of FIG. 4 is a bistable switch according to this invention, nearly identical to that of FIG. 3 save that a common-source MOSFET pair, Qsw1 and Qsw2, replaces Qsw, allowing bipolar operation as indicated by an AC voltage source being shown for Vpwr. It should be noted that the need for a common-source pair is dictated by the present practice of tying MOSFET substrates to their sources. Should demand and process changes make bidirectionally-blocking MOSFET's common, the need for a common-source pair to practice this bipolar-blocking embodiment of this invention might be obviated.

Figure 5:
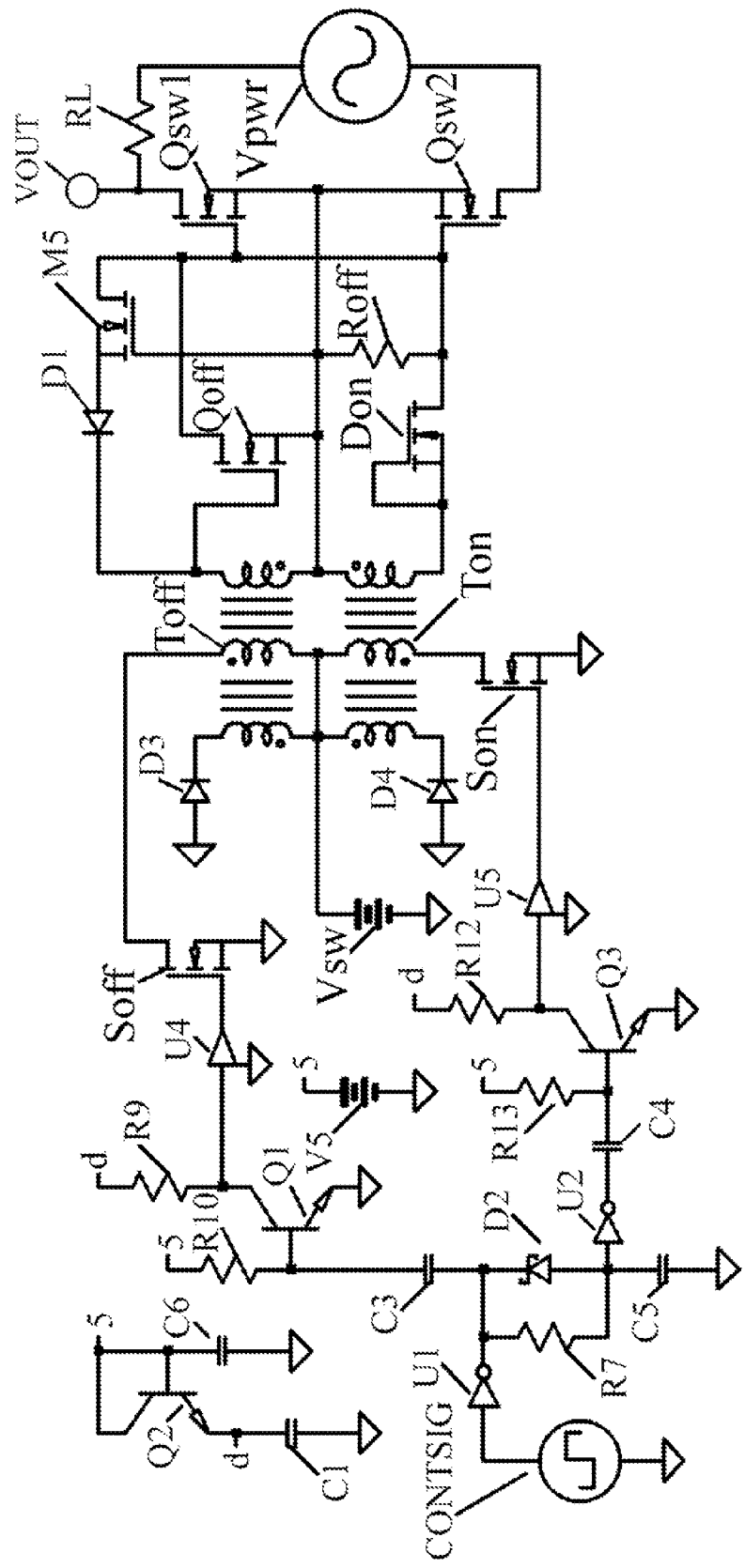
FIG. 5 is a detailed schematic diagram of a practical embodiment of the switch of FIG. 4.

FIG. 5 is a detailed diagram of an embodiment of the switch of FIG. 4. In this case voltage source Vpwr is a 50V pk., 100 kHz, sine wave. Load resistor RL is preferably about 1 ohm. Qsw1 and Qsw 2 are preferably international Rectifier type IRFBSS13207ZPBF. Resistor Roff is preferably about 1 megohm. MOSFET Qoff, is preferably Vishay type Si6925, as are Son, Soff, and Don, for which the body diode of the MOSFET is used. MOSFET M5, preferably type 2N7002, is used to clear the small amount of charge that gets trapped in the gate structures of Qsw1 and Qsw2, otherwise trickling out after the gates have been discharged to zero volts, possibly slightly enhancing Qsw1 and Qsw2 during OFF-time. Diode D1, preferably type 1N4148, draws the current for M5 from the flyback of transformer Toff.

Transformers Ton and Toff preferably have trifilar three-turn windings on Magnetics Incorporated ferrite toroids YP-40603-TC, having an Al of about 1000, thus having inductances of about 9 uH. The third windings of Ton and Toff, shown only in this figure, return energy from the magnetic fields of their respective transformers to enhancement supply Vsw. These reset currents pass through diodes D3 and D4, preferably Zetex type ZHCS1000. The remaining circuitry described below corresponds to PGon and PGoff of earlier FIG. 4. Driving Son and Soff are CMOS buffers U4 and U5 respectively, preferably both included in one Fairchild type NC7WZ16.

5V logic power supply V5 is bypassed by capacitor C6, preferably about 100 nF. Diode-connected transistor Q2, preferably type 2N5089, provides approximately 4.4V with a positive temperature coefficient to the node labeled "d", which is bypassed by capacitor C1, preferably about 100 nF. CMOS inverter U1 is, along with U2, both preferably part of Fairchild type NC7WZ04. U1 and U2 are powered by node "d", causing their output swings to share the positive TC thereof. The reason that node "d" powers resistors R9 and R13 is to reduce voltage stress on silicon-germanium transistors Q1 and Q3, preferably NEC type NESG2021.

Assuming the control signal CONT SIG to be positive, the output of U1 must be near zero. If capacitor C5, preferably about 33 pF, be positive, it will quickly discharge to about 300 mV through diode D2, Vishay type BAT54, after which it will decay toward zero through resistor R7, about 1 k. Capacitor C4, about 56 pF, is charged approximately between node "d" and the Vbe of Q3. Q3 is held ON by current from V5 through resistor R13, about 2.74 k.

Upon the falling edge of the control signal CONT SIG the output of U1 swings positive, charging C5 positive through R7. In about 30 ns, C5 reaches the threshold voltage of U2, causing its output to swing to zero, and driving the base of Q3 about 4.4 volts below its previous Vbe level. Q3 quickly turns OFF and its collector rises quickly to nearly 5V, crossing the threshold of U5. U5 then drives positive the gate of Son, turning it ON, and applying essentially Vsw to the primary winding of Ton. A voltage essentially equal to Vsw then appears across the secondary winding of Ton, turning on Don and enhancing Qsw1 and Qsw2.

As all this is happening, current is flowing in R13, charging positive C4 through its connection thereto. After about 100 ns, the base voltage of Q3 reaches its Vbe, and current formerly flowing from R13 into C4 now flows into the base of Q3 turning it ON. The collector of Q3 falls to near zero, below the threshold of U5, causing the output of U5 to drive the gate of Son to near zero. Son turns OFF and Ton causes its drain to fly positive. The voltage applied to Don swings negative, turning OFF Don. Unless dynamically discharged, the gates of Qsw1 and Qsw2 will now remain positive for many milliseconds, slowly draining their charge through Roff. Thus C4, R13, Q3, and resistor R12 comprise a pulse generator corresponding to PGon of FIG. 4.

At the end of the 100 nS pulse the magnetizing current of Ton drives the drain of Son positive and the cathode of D4 negative, turning ON D4. Much of energy of Ton is thus returned to Vsw as this current decays, resetting Ton.

When the switch of this figure is to be turned OFF, CONT SIG swings positive, driving the output of U1 to near zero. Just as Son was turned ON by U4 for about 100 ns upon a negative excursion of the output of U2, Soff is similarly turned ON for about 100 ns when the output of U1 goes to zero. Capacitor C3, about 56 pF, resistor R10, about 2.74 k, transistor Q1, type NESG2021, and R9, about 4.7 k, comprise a pulse generator corresponding to PGoff of FIG. 4. Just as the pulse of Ton turned on Don, the pulse of Toff enhances Qoff, causing it to discharge to near zero in but a few ns the voltage on the gates of Qsw1 and Qsw2, turning OFF the latter quickly. After about 100 ns, the pulse ends and the magnetizing current of Toff is returned to Vsw through diode D3.

It can be seen that R7 and C5 delay the ON pulse some 30 nS relative to the analogous OFF pulse. This extra 30 ns enforces "break-before-make" action, preventing well-known "shoot-through" when these switches are arranged in "totem-pole" pairs.

The application using the embodiment of FIG. 5 did not need the ON refresh capability of FIG. 3, so both ON and OFF signals were derived from CONT SIG.

The switch of FIG. 5 is exceedingly fast despite relatively large MOSFETS Most current is commuted within 10 ns and the transition is complete in well under 30 ns.

Since Ton can recover during the OFF pulse, and Toff during the ON pulse, this switch can toggle at a rate of 5 MHz.

The energy of the ON gate-charge of Qsw1 and Qsw2 is partly dissipated in Qoff when the switch is turned OFF, but much is dissipated within Qsw1 and Qsw2 themselves, making attempts to recover gate energy inefficient. Should changes to MOSFETS make their gates less dissipative, such recovery might become practical. At this time, the physical embodiment of this figure draws from Vsw a current closely corresponding to the theoretical minimum of the product of the sum of the gate-charges of Qsw1 and Qsw2 and the number of ON-OFF cycles per second.

Figure 6:
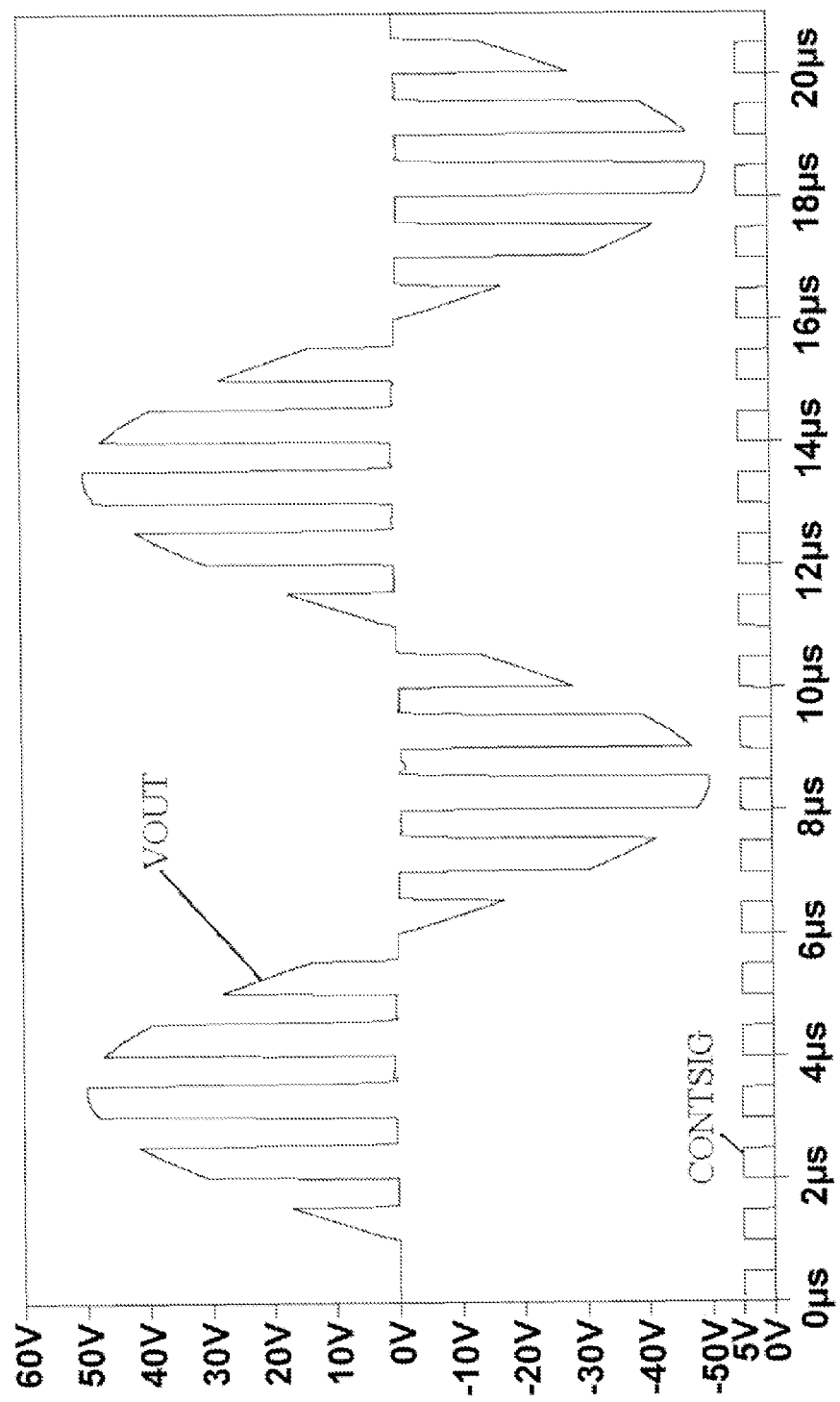
FIG. 6 shows waveforms of the switch of FIG. 5 in operation.

FIG. 6 shows control signal CONSTIG and output VOUT waveforms of the embodiment of FIG. 5 with Vpwr being a 50 V pk., 100 kHz, sine wave and load resistor RL being about 1 ohm. The waveforms shown are clear because they were generated in SPICE, those of physical embodiments of FIG. 5 being but slightly corrupted by lack of high-frequency common-mode rejection of available oscilloscopes.

The state of the switches in the present design can be interrupted by high dv/dt transients across the terminals of the device. The present invention circumvents the limitation of prior art totem-pole drivers. According to the invention above, we perform but a single task at each transition. To enhance, we switch a voltage source through a diode into the gate, thus charging the gate. To deplete, we use a fast switch to discharge the gate. Thus the ON and OFF states are implemented. The application of multiple ON or OFF pulses, as discussed above, in order to maintain the MOS device in the desired state is one way to address dV/dT related turn-on caused by an externally applied drain-voltage transient.

In a given apparatus, it is not unusual for all the transitions occurring in various parts of the apparatus to be accessible signals. In fact, modern apparatus often comprises circuitry for generating all needed signals from a common clock. In such a case, the time when an event external to a MOS device is likely to impress a disruptive dV/dT transient thereupon usually can be known. If an extra ON or OFF pulse, according to the polarity of the disruption, be generated responsive to disruptive event timing, dV/dT related turn-on, or turn-off, may be avoided. This is the first way of practicing the present invention.

In cases where it is impossible or inconvenient to time extra ON or OFF pulses, the present invention may thus be practiced by changing the high-impedance time between the ON and OFF drivers of power totem-poles to allow bistable power-device gate behavior during the time with both ON and OFF drivers inactive. Doing so is a mere extension of the idea of using power-device gate bistability between ON and OFF pulses. If the time of bistability be minimized, very little additional risk of a disruptive dV/dT event is incurred than with a the prior art totem-poll in which both upper and lower power-device gates are held OFF for a dead-time usually exceeding 10 nS. Thus according to this invention, an intermediate bistable state of gate-floating occurs between the exercise of the ON driver and the OFF driver. As long as both drivers do not conduct current from the gate during this time, the gate bistably maintains itself in its last state, save in the unlikely event of a disruptive dV/dT event during this brief period. This invention is practiced whenever the gate bistably maintains itself in its last state, whether such bistability is allowed by the embodiment of FIGS. 4 and 5 or by totem-pole driver(s) endowed with a high-impedance state wherein both upper and lower drivers are OFF simultaneously. It is crucial to realize that the high-impedance dead-time of this invention makes rapid totem-pole transitions far easier to implement than the low-impedance dead-time of the prior art that requires both upper and lower totem-pole to coact precisely in little time.

In prior art switch drivers, each gate is connected to either an ON or an OFF signal. This invention is practiced when a third, high impedance state is employed at a gate. At some interval before a switch is to be turned OFF or turned ON, it's gate drive is placed in the high impedance state, thereby utilizing the inherent bistability of the switch. When the switch state is subsequently changed, only one operation must take place, that of applying the ON or the OFF signal. With but a brief period in the high impedance state; the possibility of a DV/DT disruption is minimal.

A conventional totem pole is a "switch" in name only. It is actually, at high speeds, an amplifier. It has slew-rate limits which extend the duration of the switching transitions. For decades, we have been able to switch faster than we can amplify. Therefore, at this time, this invention is presently best practiced with available devices that behave more like switches than does a conventional totem-pole, which behaves much like an amplifier.

While prior art MOSFET or IGBT drivers provide gate-charge, the switch of this invention has several unique features:

Preferably, rather than storing enhancement charge in an external capacitor, charge is stored in the gate structure itself, minimizing stored charge and facilitating fast switching.

This invention provides bistable switching, eliminating the need to store its state in logic.

Preferably, this invention removes the need for high-side driver power supplies and provides galvanic high-side isolation, allowing a single low-side power supply to supply all gate drive needs.

Preferably, this invention slowly leaks away gate-charge providing a default OFF switch condition.

The drive of this invention provides fast supply and removal of gate-charge, enabling fast transitions.

The ON and OFF gate-charge states of this invention are responsive only to control signals, independent of the state of the voltage being switched.

While the invention has been described herein using MOSFETs or IGBTs the design is not intended to be limited to these types of switches, but is meant to include any switch with a charge storing gate whether now known or hereinafter invented. All such devices are referred to herein as "gate-charged power transistor."

What is claimed is:

1. A substantially bistable gate-charge-retaining power-switch comprising;
   at least one gate-charge-retaining power transistor; and
   control circuitry responsive to at least one control signal, said control circuitry capable of injecting charge into and removing charge from the gate of the power transistor responsive to the control signal, and
   circuitry responsive to at least one timing signal capable of modulating the impedance at the gate node of the power transistor to prevent disturbances of a bistable state by fast voltage changes,
   wherein the power switch is bistable.

2. The switch of claim 1 wherein gate node impedance is modulated by application of plural ON signals per OFF signal.

3. The switch of claim 1 wherein gate node impedance is modulated by application of plural OFF signals per ON signal.

4. The switch of claim 1 wherein gate node impedance is modulated by generation of a high-impedance driver-dead state between ON signals and OFF signals.

5. The switch of claim 1 wherein plural power transistors are arranged in totem-pole configuration.

* * * * *